US011382239B2

(12) United States Patent
Wang

(10) Patent No.: US 11,382,239 B2
(45) Date of Patent: Jul. 5, 2022

(54) FAN MODULE

(71) Applicant: ACCTON TECHNOLOGY CORPORATION, Hsinchu (TW)

(72) Inventor: Hong-Si Wang, Hsinchu (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/030,344

(22) Filed: Sep. 23, 2020

(65) Prior Publication Data

US 2021/0161031 A1   May 27, 2021

(30) Foreign Application Priority Data

Nov. 25, 2019   (TW) .................................. 108215612

(51) Int. Cl.
*H05K 7/20* (2006.01)
*H01R 12/75* (2011.01)
*H01R 13/66* (2006.01)

(52) U.S. Cl.
CPC ......... *H05K 7/20718* (2013.01); *H01R 12/75* (2013.01); *H01R 13/665* (2013.01); *H05K 7/20172* (2013.01)

(58) Field of Classification Search
CPC .. H05K 7/20718; H05K 7/20709; H05K 7/20; H05K 7/20172; H05K 7/20009; H01R 13/665; H01R 13/66
USPC ...................................................... 439/485
See application file for complete search history.

(56) References Cited

U.S. PATENT DOCUMENTS

| | | | | |
|---|---|---|---|---|
| 5,668,429 A * | 9/1997 | Boyd, Jr. | ............... | H02K 1/165 310/179 |
| 6,219,236 B1 * | 4/2001 | Hirano | ............... | H01L 23/467 257/E23.099 |
| 6,223,416 B1 * | 5/2001 | Boyd, Jr. | ............... | H02K 1/165 29/596 |
| 6,330,977 B1 * | 12/2001 | Hass | ............... | G06F 3/0383 235/487 |
| 7,352,174 B1 * | 4/2008 | Lee | ............... | G01D 11/245 324/207.25 |
| 9,163,956 B2 * | 10/2015 | Mizunuma | ............. | G01D 5/145 |
| 10,120,424 B2 * | 11/2018 | Kim | ............... | H05K 1/092 |
| 10,648,880 B2 * | 5/2020 | Na | ............... | G01L 19/0038 |
| 10,826,355 B2 * | 11/2020 | Kanazawa | ............... | H02K 5/10 |
| 2008/0124234 A1 * | 5/2008 | Echazarreta | ............. | F04D 29/541 417/423.14 |
| 2008/0218158 A1 * | 9/2008 | Carlson | ............... | G01R 33/07 324/207.2 |
| 2011/0227563 A1 * | 9/2011 | Akahane | ............... | G01D 5/145 324/207.25 |
| 2012/0160596 A1 * | 6/2012 | Yamasaki | ............... | H02K 5/225 180/443 |
| 2012/0257999 A1 * | 10/2012 | Hsieh | ............... | F04D 29/64 417/423.14 |

(Continued)

*Primary Examiner* — Harshad G Patel
(74) *Attorney, Agent, or Firm* — CKC & Partners Co., LLC

(57) ABSTRACT

A fan module configured to be detachably connected to an electronic device includes an electrical connector and a circuit board assembly. The electrical connector includes a plurality of pins configured to be electrically connected to the electronic device. The circuit board assembly is embedded inside the electrical connector and is electrically connected to one or more of the pins. The circuit board assembly includes a circuit board and an integrated circuit disposed on the circuit board.

16 Claims, 4 Drawing Sheets

(56) References Cited

U.S. PATENT DOCUMENTS

| | | | |
|---|---|---|---|
| 2013/0204486 A1* | 8/2013 | Yu ..................... | B60C 23/0494 |
| | | | 701/32.7 |
| 2015/0159656 A1* | 6/2015 | Urabe ................ | F24D 11/0214 |
| | | | 165/104.31 |
| 2015/0180316 A1* | 6/2015 | Maeshima .......... | B62D 5/0406 |
| | | | 310/71 |
| 2018/0115225 A1* | 4/2018 | Togawa .................. | H02K 9/22 |

* cited by examiner

FAN MODULE

RELATED APPLICATIONS

This application claims priority to Taiwan Application Serial Number 108215612, filed Nov. 25, 2019, the disclosure of which is incorporated herein by reference in its entirety.

BACKGROUND

Technical Field

The present disclosure relates to a fan module.

Description of Related Art

Pluggable fan modules are widely adopted in electronic devices such as computer servers or network devices to improve cooling. Depending on the application requirements, the fan module may incorporate additional electronic component(s) to provide extra functionalities. A conventional approach involves adding a circuit board behind the existing fan connector to carry the electronic component(s) and to connect to the existing connector, and forming another connector on the circuit board to connect to the electronic device. This approach has the following drawbacks: (1) requires modification of existing fan module structure, e.g., adding a bracket to hold the circuit board; (2) existing circuits of the fan module are routed through the circuit board and connected to the electronic device via the new connector on the circuit board, complicating the layout of the circuit board, in addition, in order to avoid signal interference, ESD protection components must be installed on the circuit board, increasing the size of the circuit board and the overall size of the fan module; (3) the bracket typically holds the circuit board at a position higher than that of the existing connector, blocking the airflow passing through the fan module; (4) in order to prevent warpage or damage of circuit board, which may result from frequent plugging and unplugging of the connector, the thickness and material of the circuit board are subject to more limitations (e.g., thickening circuit board to improve the structural strength of the connector), resulting in an increase in production cost.

SUMMARY

In view of the foregoing, one of the objects of the present disclosure is to provide a novel fan module that enables the addition of integrated circuit to provide extra functionalities without modifying existing fan module structure, thereby avoiding the issues mentioned above.

To achieve the objective stated above, in accordance with an embodiment of the present disclosure, a fan module configured to be detachably connected to an electronic device includes an electrical connector and a circuit board assembly. The electrical connector includes a plurality of pins configured to be electrically connected to the electronic device. The circuit board assembly is embedded inside the electrical connector and is electrically connected to one or more of the pins. The circuit board assembly includes a circuit board and an integrated circuit disposed on the circuit board.

In one or more embodiments of the present disclosure, the fan module further includes at least one first conductive cable electrically coupling the integrated circuit and one or more of the pins.

In one or more embodiments of the present disclosure, the circuit board has at least one electrical contact located on a side of the integrated circuit. The first conductive cable is connected between the electrical contact and one or more of the pins.

In one or more embodiments of the present disclosure, the fan module further includes a fan and at least one second conductive cable. The circuit board assembly is located between the fan and the pins. The second conductive cable electrically couples the fan and one or more of the pins, without making electrical connection with the circuit board assembly.

In one or more embodiments of the present disclosure, the circuit board has a cable passage for the second conductive cable to pass through.

In one or more embodiments of the present disclosure, the cable passage is a cutout on a periphery of the circuit board.

In one or more embodiments of the present disclosure, the circuit board has a fixing hole. The fixing hole is configured to allow a fixing member to pass through to secure the circuit board assembly inside the electrical connector.

In one or more embodiments of the present disclosure, the circuit board has at least one through hole for air to pass through.

In one or more embodiments of the present disclosure, the integrated circuit is a memory device configured to store information associated with the fan module.

In one or more embodiments of the present disclosure, the memory device is an electrically erasable programmable read-only memory chip.

In sum, the fan module of the present disclosure includes a circuit board assembly embedded inside the electrical connector, thereby enabling the addition of integrated circuit to provide extra functionalities without modifying existing fan module structure/wiring.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
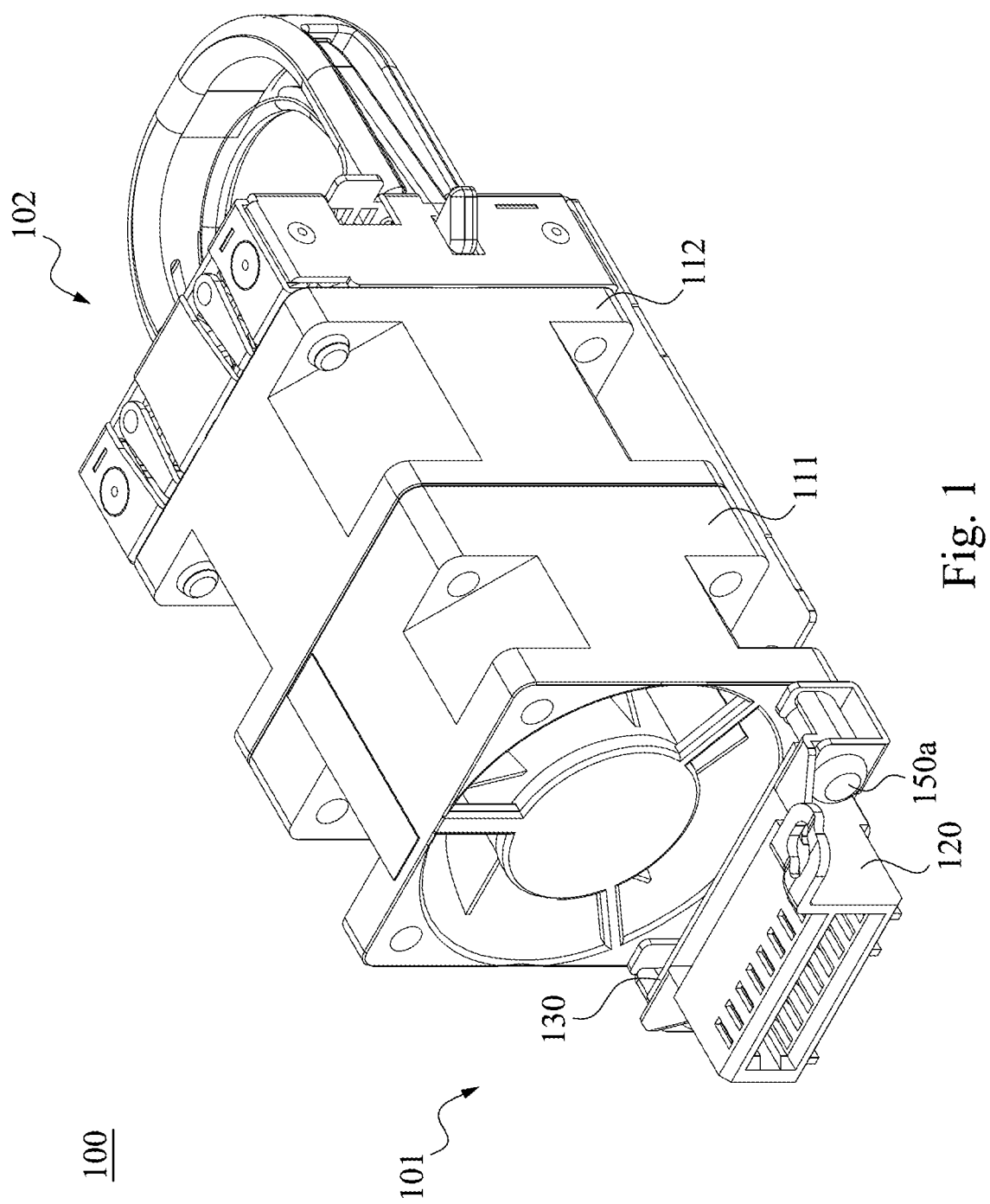
FIG. 1 illustrates a perspective view of a fan module in accordance with an embodiment of the present disclosure.

For the sake of the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Reference is made to FIG. 1, which illustrates a perspective view of a fan module 100 in accordance with an embodiment of the present disclosure. The fan module 100 is configured to be detachably connected to an electronic device (not depicted). In the present embodiment, the fan module 100 is a cooling fan module of a network switch/router. The fan module 100 includes two fans 111 and 112, an electrical connector 120 and a circuit board assembly 130. The fans 111 and 112 are arranged in a line (i.e., one behind another) and are configured to generate airflow. It should be realized that although the fan module 100 is exemplified as having two fans, the skilled person may configure the fan module with a single fan or more than two fans based on application requirements. The fan module 100 includes a first side 101 and a second side 102 opposite to the first side 101. The fans 111 and 112 are configured to generate airflow flowing from the first side 101 of the fan module 100 towards the second side 102, so as to bring excessive heat out of the electronic device through the second side 102 of the fan module 100.

As shown in FIG. 1, the electrical connector 120 is electrically connected to the electronic device and the fans 111 and 112. Accordingly, the fans 111 and 112 can be powered by the electronic device or exchange information with the electronic device through the electrical connector 120. In the present embodiment, the electrical connector 120 is a female connector configured to be connected with a matched male connector (not depicted) on the electronic device, thereby establishing a solid electrical connection between the fan module 100 and the electronic device.

Figure 2:
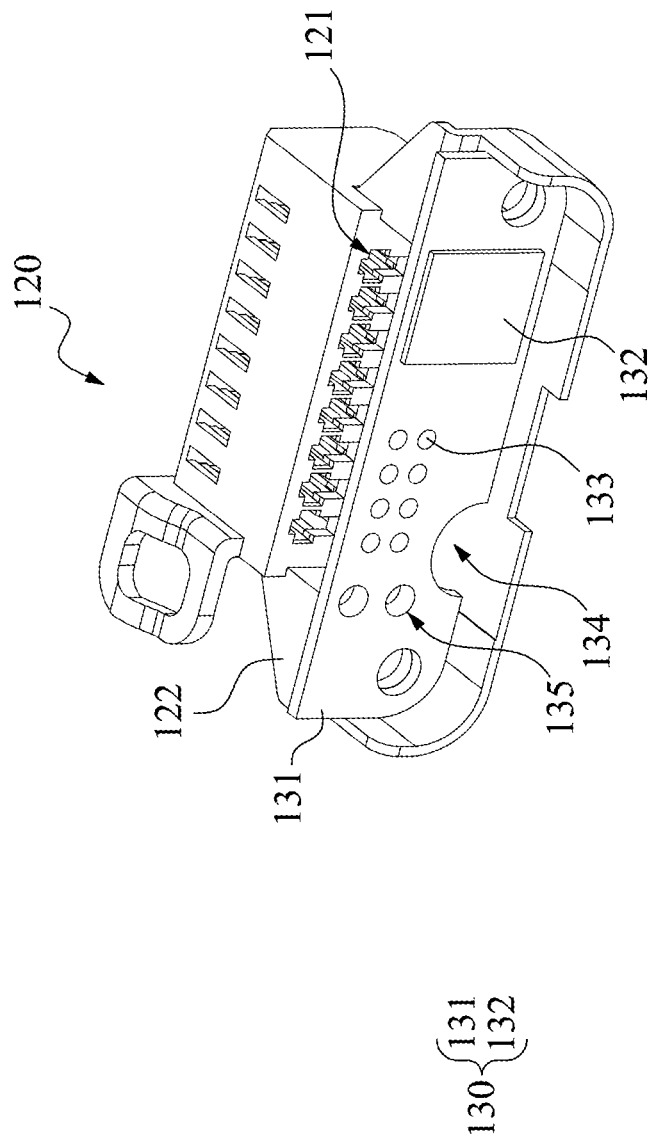
FIG. 2 illustrates an assembled view of the electrical connector and the circuit board assembly of the fan module shown in FIG. 1.

Reference is made to FIG. 2, which illustrates an assembled view of the electrical connector 120 and the circuit board assembly 130 of the fan module 100 shown in FIG. 1. The circuit board assembly 130 includes a circuit board 131 and an integrated circuit 132 disposed on the circuit board 131, and it can be embedded inside the electrical connector 120. In the present embodiment, the integrated circuit 132 is mounted on a surface of the circuit board 131 facing the fan 111 (e.g., see FIG. 1). The electrical connector 120 is electrically connected to the circuit board assembly 130, such that the integrated circuit 132 of the circuit board assembly 130 can be powered by the electronic device or exchange information with the electronic device through the electrical connector 120. In some embodiments, the circuit board 131 is a printed circuit board (PCB). In some embodiments, the circuit board 131 is a double-layered PCB.

The integrated circuit 132 may provide additional functionalities for the fan module 100, such as storage or computation. In some embodiments, the integrated circuit 132 is a memory device configured to store information associated with the fan module 100 such as a serial number of the fan module 100, operating voltage/current, manufacturer and rotational speed. The electronic device is electrically connected to the integrated circuit 132 and can thus access said information. In some embodiments, the memory device is an electrically erasable programmable read-only memory (EEPROM) chip. In some embodiments, the memory device (i.e., the integrated circuit 132) is an EEPROM chip with inter-integrated circuit (I2C) interface.

As shown in FIG. 2, the electrical connector 120 includes a housing 122 and a plurality of pins 121. The pins 121 are disposed on an end of the housing 122 and are configured to be electrically connected to the electronic device (e.g., the pins 121 are electrically connected to the matched male connector on the electronic device). The circuit board assembly 130 is located between the fan 111/112 (e.g., see FIG. 1) and the pins 121, and is electrically connected to one or more of the pins 121.

Figure 3:
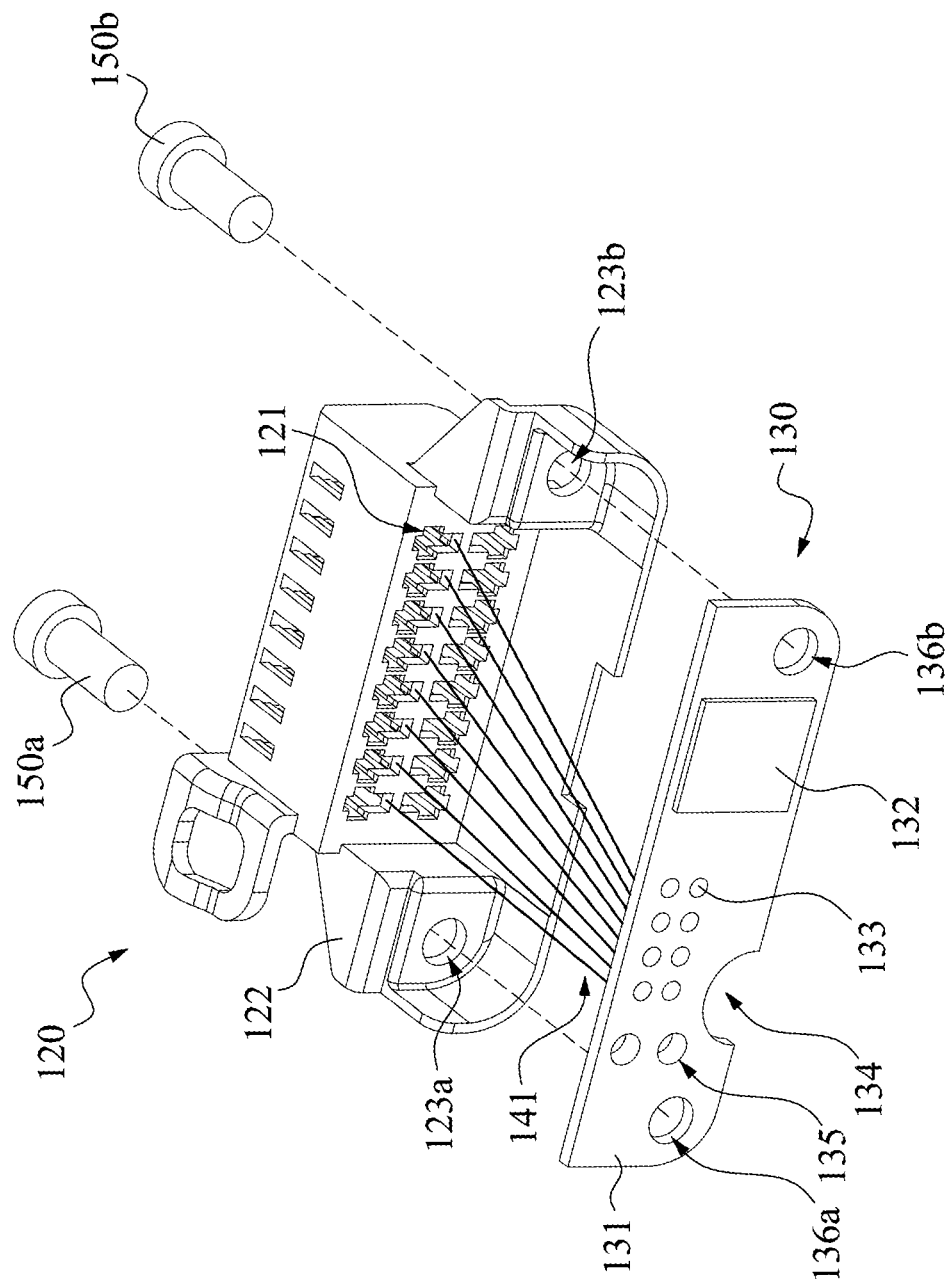
FIG. 3 illustrates an exploded view of the electrical connector and the circuit board assembly shown in FIG. 2, and schematically depicts some cables of the fan module.

Reference is made to FIG. 3, which illustrates an exploded view of the electrical connector 120 and the circuit board assembly 130 shown in FIG. 2 for the present embodiment, and schematically depicts some cables of the fan module 100. The fan module 100 further includes at least one conductive cable 141 (which is plural in number in the present embodiment) electrically coupling the integrated circuit 132 and one or more of the pins 121. The circuit board 131 has at least one electrical contact 133 (which is plural in number in the present embodiment). The electrical contacts 133 are located on a side of the integrated circuit 132, and each of the electrical contacts 133 corresponds to a different pin of the integrated circuit 132. Each of the conductive cables 141 is connected between a corresponding electrical contact 133 and a corresponding pin 121. The integrated circuit 132 and the electrical contacts 133 are electrically connected via routes/traces of the circuit board 131. By this arrangement, electronic signal may be transmitted to or received from the electronic device via the routes/traces of the circuit board 131, the electrical contacts 133, the conductive cables 141 and the pins 121. In the present embodiment, the pins 121 are arranged in two rows, and the conductive cables 141 are connected to the pins 121 on the upper row. In some embodiments, an end of the conductive cable 141 is welded to the electrical contact 133. In some embodiments, the conductive cables 141 include a signal cable and a ground cable that form a twisted pair to reduce noise.

Figure 4:
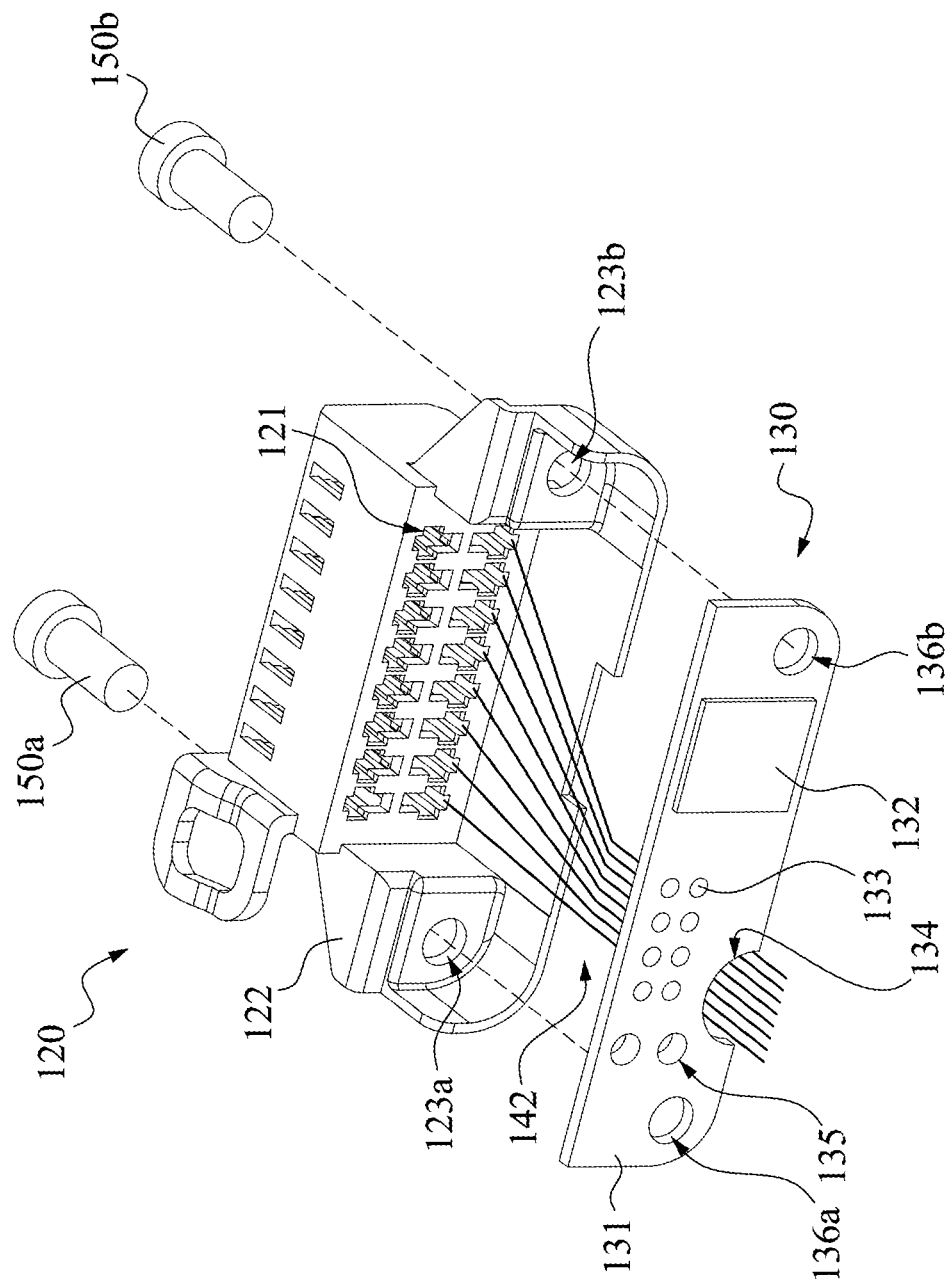
FIG. 4 illustrates an exploded view of the electrical connector and the circuit board assembly shown in FIG. 2, and schematically depicts some other cables of the fan module.

Reference is made to FIG. 4, which illustrates an exploded view of the electrical connector 120 and the circuit board assembly 130 shown in FIG. 2, and schematically depicts some other cables of the fan module 100 (the conductive cables 141 are omitted in FIG. 4). The fan module 100 further includes at least one conductive cable 142 (which is plural in number in the present embodiment) electrically coupling the fan 111/112 and one or more of the pins 121, without making electrical connection with the circuit board assembly 130. In the present embodiment, the pins 121 are arranged in two rows, and the conductive cables 142 are connected to the pins 121 on the lower row.

Under the above configuration, the circuit board assembly 130 may be added to the fan module 100 without altering the arrangement of the fans 111 and 112, the electrical connector 120 and the conductive cable 142. Unlike conventional fan modules, in the fan module 100 of the present disclosure, the circuit board assembly 130 is embedded inside the electrical connector 120, and the conductive cable 142 connecting the fan 111/112 and the electrical connector 120 bypasses the circuit board assembly 130. Since the conductive cable 142 does not make electrical connection with the circuit board assembly 130, the circuit board assembly 130 is not required to include the signal and/or power circuits for the fans 111 and 112. Accordingly, the size of the circuit board assembly 130 may be reduced as the number of ESD protection components required to be installed on the circuit board 131 may be lowered. And for that reason, the overall size of the fan module 100 equipped with the circuit board assembly 130 can be reduced as well.

Furthermore, since the conductive cables 142 bypass the circuit board assembly 130, the need for forming a connector on the circuit board assembly 130 is eliminated. Also, the electrical connector 120 may directly serve as a communication interface between the circuit board assembly 130 and the electronic device. It is noted that for a circuit board with a connector, the structure of the circuit board needs to be strengthened to prevent damage resulting from the connector being plugged and unplugged frequently. However, in the fan module 100 of the present disclosure, the circuit board 131 of the circuit board assembly 130 can be designed with fewer restrictions due to having no connector thereon, whereby the benefit of thinner design, more flexible choice of material, and lowered production cost can be obtained. In some embodiments, the circuit board 131 of the circuit board assembly 130 and a main board inside the fan module 100 (not depicted; the main board may include control circuits for the fans 111 and 112) may be of equal thickness and can thus be manufactured together to further reduce production cost.

As shown in FIG. 4, in some embodiments, the circuit board 131 has a cable passage 134 for the conductive cables 142 to pass through and connect to the pins 121 of the electrical connector 120. In the present embodiment, the cable passage 134 is a cutout on a periphery of the circuit board 131. The circuit board 131 has a lower edge abutting against the housing 122 of the electrical connector 120. The conductive cables 142 passing through the cable passage 134 is held between the circuit board 131 and the housing 122. In some embodiments, the cable passage may be a through hole on the circuit board 131. In some embodiments, the lower edge of the circuit board 131 and the housing 122 of the electrical connector 120 keep a gap therebetween. The conductive cables 142 may pass through said gap and connect to the pins 121.

In some embodiments, the conductive cables 142 include power cable, ground cable, frequency generator signal cable, pulse width modulation (PWM) signal cable for the fan 111/112. The fan 111/112 may provide information regarding its rotational speed to the electronic device through the frequency generator signal cable. The electronic device may transmit control signals of differing duty cycles to the fan 111/112 through the pulse width modulation signal cable to control the rotational speed of the fan 111/112.

As shown in FIGS. 3 and 4, in some embodiments, the circuit board 131 has at least one through hole 135. The through hole 135 runs through the circuit board 131 and faces the pins 121. The through hole 135 is configured to allow air to pass through to reduce airflow blockage. The through hole 135 is located outside of an area of the circuit board 131 where the integrated circuit 132, the electrical contacts 133 and the internal routes/traces of the circuit board 131 are arranged.

As shown in FIGS. 3 and 4, in some embodiments, the housing 122 of the electrical connector 120 has first fixing holes 123a and 123b configured to allow fixing members 150a and 150b to pass through respectively, so as to secure the electrical connector 120 on a side of the fan 111. In the present embodiment, the fixing members 150a and 150b are screws. In some embodiments, the circuit board 131 has second fixing holes 136a and 136b on its two sides. The second fixing holes 136a and 136b configured to be aligned with the first fixing holes 123a and 123b respectively. The second fixing holes 136a and 136b are configured to allow the fixing members 150a and 150b to pass through respectively. The fixing member 150a/150b passes through the first fixing hole 123a/123b and the second fixing hole 136a/136b to secure the circuit board assembly 130 inside the electrical connector 120, thereby preventing the displacement of the circuit board assembly 130 after the fans 111 and 112 are started.

In sum, the fan module of the present disclosure includes a circuit board assembly embedded inside the electrical connector, thereby enabling the addition of integrated circuit to provide extra functionalities without modifying existing fan module structure/wiring.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A fan module configured to be detachably connected to an electronic device, the fan module comprising:
    an electrical connector comprising a plurality of pins, the pins configured to be electrically connected to the electronic device;
    a circuit board assembly embedded inside the electrical connector and electrically connected to one or more of the pins, the circuit board assembly comprising a circuit board and an integrated circuit disposed on the circuit board;
    a fan, wherein the circuit board assembly is located between the fan and the pins; and
    at least one first conductive cable electrically coupling the fan and one or more of the pins, without making electrical connection with the circuit board assembly.

2. The fan module of claim 1, further comprising:
    at least one second conductive cable electrically coupling the integrated circuit and one or more of the pins.

3. The fan module of claim 2, wherein the circuit board has at least one electrical contact located on a side of the integrated circuit, and the at least one second conductive cable is connected between the at least one electrical contact and one or more of the pins.

4. The fan module of claim 1, wherein the circuit board has a cable passage for the at least one first conductive cable to pass through.

5. The fan module of claim 4, wherein the cable passage is a cutout on a periphery of the circuit board.

6. The fan module of claim 1, wherein the circuit board has a fixing hole, the fixing hole is configured to allow a fixing member to pass through to secure the circuit board assembly inside the electrical connector.

7. The fan module of claim 1, wherein the circuit board has at least one through hole for air to pass through.

8. The fan module of claim 1, wherein the integrated circuit is a memory device configured to store information associated with the fan module.

9. The fan module of claim 8, wherein the memory device is an electrically erasable programmable read-only memory chip.

10. A fan module configured to be detachably connected to an electronic device, the fan module comprising:
    an electrical connector comprising a plurality of pins, the pins configured to be electrically connected to the electronic device;
    a fan;
    a circuit board assembly located between the fan and the pins, the circuit board assembly being embedded inside the electrical connector and electrically connected to one or more of the pins, the circuit board assembly comprising a circuit board and an integrated circuit disposed on the circuit board, wherein the circuit board has at least one electrical contact located on a side of the integrated circuit;

at least one first conductive cable electrically connected between the at least one electrical contact and one or more of the pins; and at least one second conductive cable electrically coupling the fan and one or more of the pins, without making electrical connection with the circuit board assembly.

11. The fan module of claim 10, wherein the circuit board has a cable passage for the at least one second conductive cable to pass through.

12. The fan module of claim 11, wherein the cable passage is a cutout on a periphery of the circuit board.

13. The fan module of claim 10, wherein the circuit board has a fixing hole, the fixing hole is configured to allow a fixing member to pass through to secure the circuit board assembly inside the electrical connector.

14. The fan module of claim 10, wherein the circuit board has at least one through hole for air to pass through.

15. The fan module of claim 10, wherein the integrated circuit is a memory device configured to store information associated with the fan module.

16. The fan module of claim 15, wherein the memory device is an electrically erasable programmable read-only memory chip.

* * * * *